United States Patent
Bernstein

(10) Patent No.: US 7,883,909 B2
(45) Date of Patent: Feb. 8, 2011

(54) METHOD TO MEASURE ION BEAM ANGLE

(75) Inventor: James David Bernstein, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 931 days.

(21) Appl. No.: 11/617,326

(22) Filed: Dec. 28, 2006

(65) Prior Publication Data
US 2008/0157074 A1    Jul. 3, 2008

(51) Int. Cl.
H01L 21/66    (2006.01)

(52) U.S. Cl. .................... 438/17; 438/525; 438/531; 257/E21.531

(58) Field of Classification Search .......... 250/492.21, 250/397; 438/17, 514, 515, 517, 518, 525, 438/531, 914, 944, FOR. 154, FOR. 169, 438/16; 257/E21.058, E21.059, E21.522, 257/E21.529, E21.531, E21.521, E21.525; 356/635, 636, 638

See application file for complete search history.

(56) References Cited

U.S. PATENT DOCUMENTS

| | | | | |
|---|---|---|---|---|
| 6,372,587 | B1 * | 4/2002 | Cheek et al. ................. | 438/302 |
| 6,426,262 | B1 * | 7/2002 | Fuselier et al. .............. | 438/276 |
| 6,489,223 | B1 * | 12/2002 | Hook et al. ................... | 438/524 |
| 6,791,094 | B1 * | 9/2004 | Olson et al. .................. | 250/397 |
| 6,924,215 | B2 * | 8/2005 | Huang et al. ................. | 438/506 |
| 6,933,158 | B1 * | 8/2005 | Lensing et al. ................ | 438/16 |
| 7,253,072 | B2 * | 8/2007 | Bernstein et al. ............. | 438/372 |
| 7,297,581 | B1 * | 11/2007 | Hill et al. ..................... | 438/176 |
| 7,348,576 | B2 * | 3/2008 | Gupta et al. ............ | 250/492.21 |
| 7,495,347 | B2 * | 2/2009 | Raisanen et al. ............. | 257/797 |
| 2002/0121889 | A1 * | 9/2002 | Larsen et al. ............... | 324/71.3 |
| 2003/0184769 | A1 * | 10/2003 | Houge et al. ................ | 356/636 |
| 2003/0235928 | A1 * | 12/2003 | Lu et al. ........................ | 438/5 |
| 2004/0002203 | A1 * | 1/2004 | Deshpande et al. ......... | 438/525 |
| 2004/0057052 | A1 * | 3/2004 | Borden ........................ | 356/445 |

(Continued)

FOREIGN PATENT DOCUMENTS

JP    2001-324439 A    * 11/2001

(Continued)

OTHER PUBLICATIONS

Walther, et al., "Dopant Channeling as a Function of Implant Angle for Low Energy Applications", IEEE, 1999, pp. 126-129.

(Continued)

Primary Examiner—Matthew C Landau
Assistant Examiner—Joseph C Nicely
(74) Attorney, Agent, or Firm—Warren L. Franz; Wade J. Brady, III; Frederick J. Telecky, Jr.

(57) ABSTRACT

A device and method for measuring ion beam angle with respect to a substrate is disclosed. The method includes forming a plurality of shadowing structures extending substantially perpendicular from an upper surface of the substrate, directing an ion beam toward the substrate, the plurality of shadowing structures interrupting an incident angle of the ion beam to define implanted and non-implanted portions of the substrate. The method further includes measuring the dose of implanted species within the substrate, determining an implanted surface area as a function of measuring the dose of implant, determining non-implanted surface area based on the implanted surface area, and obtaining the ion beam angle as a function of the non-implanted surface area.

19 Claims, 4 Drawing Sheets

U.S. PATENT DOCUMENTS

| | | | |
|---|---|---|---|
| 2005/0184255 A1* | 8/2005 | Amakawa | 250/492.21 |
| 2005/0255683 A1* | 11/2005 | Bernstein et al. | 438/525 |
| 2006/0006346 A1* | 1/2006 | Rathmell et al. | 250/492.21 |
| 2006/0024930 A1* | 2/2006 | Tews et al. | 438/525 |
| 2006/0027800 A1* | 2/2006 | MacPherson et al. | 257/40 |
| 2006/0068514 A1* | 3/2006 | Howland | 438/18 |
| 2006/0114478 A1* | 6/2006 | Borden et al. | 356/636 |
| 2006/0121706 A1* | 6/2006 | Bernstein et al. | 438/514 |
| 2006/0138355 A1* | 6/2006 | Yue et al. | 250/492.21 |
| 2006/0208202 A1* | 9/2006 | Gupta et al. | 250/492.21 |
| 2006/0240579 A1* | 10/2006 | Chi | 438/5 |
| 2006/0289798 A1* | 12/2006 | Cummings et al. | 250/492.21 |
| 2006/0289800 A1* | 12/2006 | Murrell et al. | 250/492.21 |
| 2007/0120074 A1* | 5/2007 | Rathmell et al. | 250/492.21 |
| 2008/0067434 A1* | 3/2008 | Walther et al. | 250/492.21 |
| 2008/0078952 A1* | 4/2008 | Gupta et al. | 250/492.21 |
| 2008/0096359 A1* | 4/2008 | Gupta et al. | 438/302 |
| 2009/0090872 A1* | 4/2009 | Horsky et al. | 250/427 |

OTHER PUBLICATIONS

Yoneda, et al., "The Drain Current Asymmetry of 130nm MOSFETs due to Extension Implant Shadowing Originated by Mechanical Angle Error in High Current Implanter", ULSI Process Technology Development Center, Semiconductor Company, Matsushita Electric Industrial Co., Ltd.

* cited by examiner

METHOD TO MEASURE ION BEAM ANGLE

FIELD OF THE INVENTION

The subject matter of this invention relates to devices and methods of measuring ion beam angle. More particularly, the subject matter of this invention relates to devices and methods of measuring ion beam angle using shadowing of the ion beam by dimensional structures.

BACKGROUND OF THE INVENTION

Fabrication of semiconductor devices typically includes an implantation of ions for various purposes known to those skilled in the art. In an ideal implantation without error, an ion beam will be directed normal to a plane defined by a substrate or wafer surface. It will be appreciated by those skilled in the art that angled implants are sometimes done intentionally, but it is the unintentional angle error that the present disclosure is intended to address, as these implants are undesirable. However, it will also be appreciated that the disclosure herein can easily be extended to measure error in angled implants.

However, variations in direction of ion implantation can occur. Ion beam angle error in ion implantation, particularly at the source/drain extension (SDE) step, can cause xtor parametric variation, depressed MPY, and Channel Hot Carrier (CHC) degradation, thereby degrading transistor performance and reducing product yield. It is therefore important to monitor and control ion beam angle. The SDE step may be the most sensitive step but product can be affected by angle error in other implant steps as well.

Methods for measuring an angle of an ion beam with respect to a substrate are known. These methods include crystal channeling or use of transistors. However, wafer-based methods of measuring ion implantation angle which rely on crystal channeling are not sensitive for low energy or amorphizing implants. Further, methods which use transistors are expensive and time consuming. Until now, there has been no know method of detecting angle error in low energy SDE implants, except for fabricating transistors and measuring parametrics weeks after the implants have been completed.

Accordingly, there is a need to solve these and other problems of the prior art by detecting ion implantation angle variations with high sensitivity. Further, there is a need for a method that is applicable in numerous applications, including low energy and amorphizing implants and across a wide range of species, energies, and doses; using relatively simple processing, and without the need to fabricate transistors.

SUMMARY OF THE INVENTION

In accordance with the invention, a method for measuring ion beam angle with respect to a substrate is disclosed. The method includes forming a plurality of shadowing structures extending substantially perpendicular from an upper surface of the substrate, directing an ion beam toward the substrate, the plurality of shadowing structures interrupting an incident angle of the ion beam to define implanted and non-implanted portions of the substrate. The method further includes measuring the dose of implanted species within the substrate, determining an implanted surface area as a function of measuring the dose of implant, determining non-implanted surface area based on the implanted surface area, and obtaining the ion beam angle as a function of the non-implanted surface area. Further, with the implementation of shadowing structures, ion beam angle can also be determined as a function of the implanted area or implant dose.

In accordance with the invention, a device for measuring ion beam angle with respect to a substrate includes a plurality of shadowing structures formed on a surface of the substrate, the shadowing structures interrupting an incident angle of the ion beam. A reference region is provided which is free of shadowing structures. At least a portion of the substrate is defined by an implant dose of the ion beam and a remaining portion of the substrate is free of an implant dose according to shadowing by the plurality of shadowing structures. An implanted surface area is determined as a function of a measured implant dose and a non-implanted surface area defined by a difference between a total surface area and the implanted surface area. An ion beam angle is determined as a function of the non-implanted surface area.

Additional advantages of the embodiments will be set forth in part in the description which follows, and in part will be obvious from the description, or may be learned by practice of the invention. The advantages will be realized and attained by means of the elements and combinations particularly pointed out in the appended claims.

It is to be understood that both the foregoing general description and the following detailed description are exemplary and explanatory only and are not restrictive of the invention, as claimed.

The accompanying drawings, which are incorporated in and constitute a part of this specification, illustrate embodiments of the invention and together with the description, serve to explain the principles of the invention.

DESCRIPTION OF THE EMBODIMENTS

Reference will now be made in detail to the present embodiments, examples of which are illustrated in the accompanying drawings. Wherever possible, the same reference numbers will be used throughout the drawings to refer to the same or like parts.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5.

Figure 1:
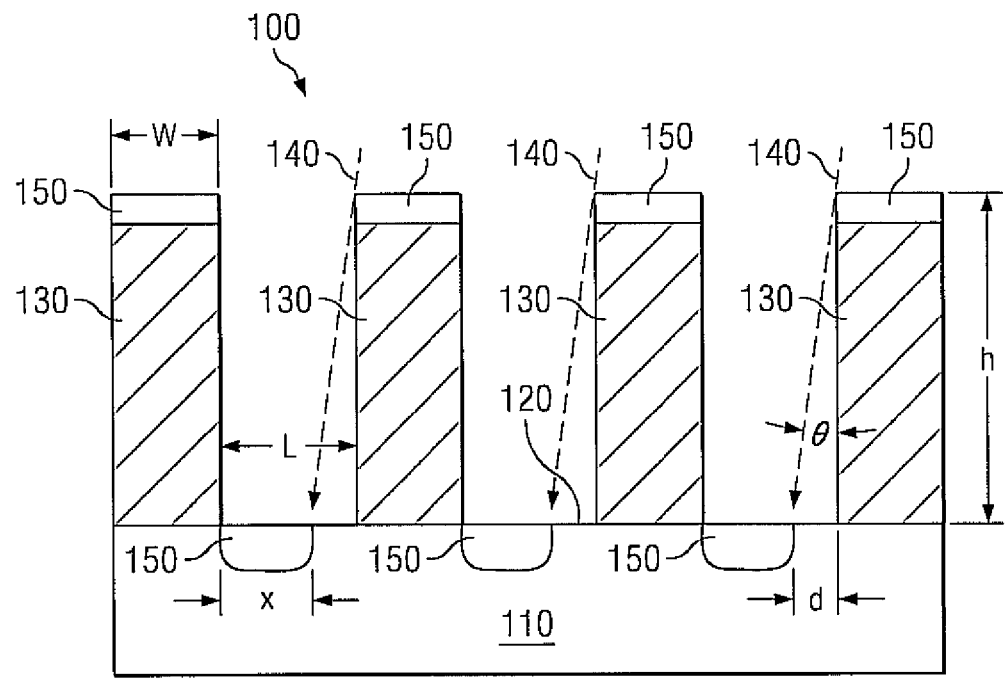
FIG. 1 is a side view illustrating ion beam angle shadowing in accordance with various embodiments of the present teachings.

Referring first to FIG. 1, a device 100 for detecting and quantifying ion beam angle variation by a shadowing method is depicted in accordance with various embodiments of the present teachings. The device 100 includes a substrate 110, three-dimensional shadowing structures 130 formed on a surface 120 of the substrate 110, and an ion beam 140 directed at the substrate 110.

The substrate 110 can be a silicon wafer known for use in semiconductor devices. While the material of the wafer is not critical to an understanding of the teachings herein, the wafer will be suitable for implantation and subsequent quantitative measurement of the ions implanted therein. By way of example, it is expected that the substrate 110 will be a silicon wafer or equivalent.

The three-dimensional structures 130 can be formed on the substrate 110 using a conventional photoresist or a hardmask. The use of three-dimensional shadowing structures enables the area of implanted substrate to become a function of the angle between the ion beam 140 and the substrate 110. The structures may be repeated lines and spaces or other configurations. As depicted in at least FIG. 1, a plurality of structures 130 define a series of like structures each spaced apart by a distance "L" on the surface 120 of the substrate 110. It will be appreciated that the distance "L" is that distance between sidewalls of adjacent structures. The number and spacing of the structures can vary according to selected measuring parameters. Further, each of the structures 130 is of a height "h" and extends transverse to the substrate 110. More specifically, it is intended that the structures 130 are perpendicular to the substrate 110.

While it is appreciated that the nature of forming the structures 130 can be imperfect, more accurate measurements will be obtained at a true perpendicular orientation of the structures 130 to the surface 120 of the substrate 110. As will be explained in further detail, however, determinations can be made regarding imperfections in the vertical (perpendicular) orientation of the structures with respect to the surface of the substrate 110.

The ion beam 140 is directed at the structures 130 and surface 120 of the substrate 110 in order to render an ion implantation into the substrate. The ion beams 140 can deposit doping material. A presence of the structures 130 interrupts a deposition or implantation to the extent that not all of the implant material reaches the substrate 110. As shown in FIG. 1, an upper surface of each of the plurality of structures 130 also receives the implant material. If an incident angle of the ion beam is offset from normal (perpendicular to the substrate), then a shadowing effect occurs whereby those portions of the substrate "shadowed" by the structures 130 do not receive the ion implant. The shadowed portion of the substrate is defined by a distance "d", whereas the implanted portion of the substrate is defined by the distance "x". As previously described, an overall distance between adjacent ones of the plurality of structures 130 is defined by "L". Accordingly, it will be appreciated that the shadowed distance is the difference between the overall distance "L" and the implanted distance "x" such that x=L−d. The implanted dose is proportional to x=L−d. Then, the shadowed distance "d" depends on the angle error (θ), where d=htan(θ).

Thus, the amount of shadowing of the substrate 110 by the structures 130 is also a function of the angle the ion beam 140 makes with the substrate 110 as shown in FIG. 1. The area "x" implanted by the beam will then be a function of the ion beam angle θ. Thus, the areal density or dose of the implanted species is a function of the angle that the ion beam makes with the substrate 110.

Once an ion beam implant has occurred, the plurality of structures 130 are removed from the substrate 110. Subsequent to removal of the structures 130, the measurement of the implanted dose in the substrate 110 can be made.

Even further, orientation of the structures 130 in x- and y-directions enable measurements of ion beam angle in two dimensions as will be further described in connection with FIG. 5.

Figure 2A:
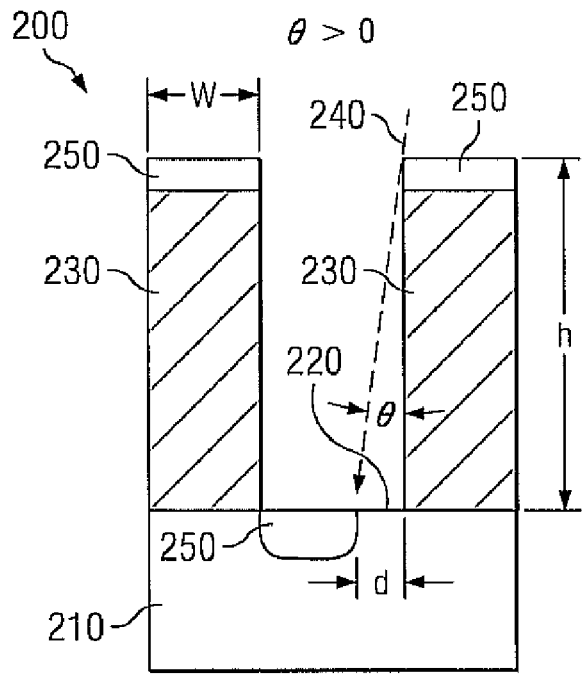
FIGS. 2A and 2B are side views illustrating different ion beam angle shadowing with respect to a non-tilted substrate in accordance with various embodiments of the present teachings.
Figure 2B:
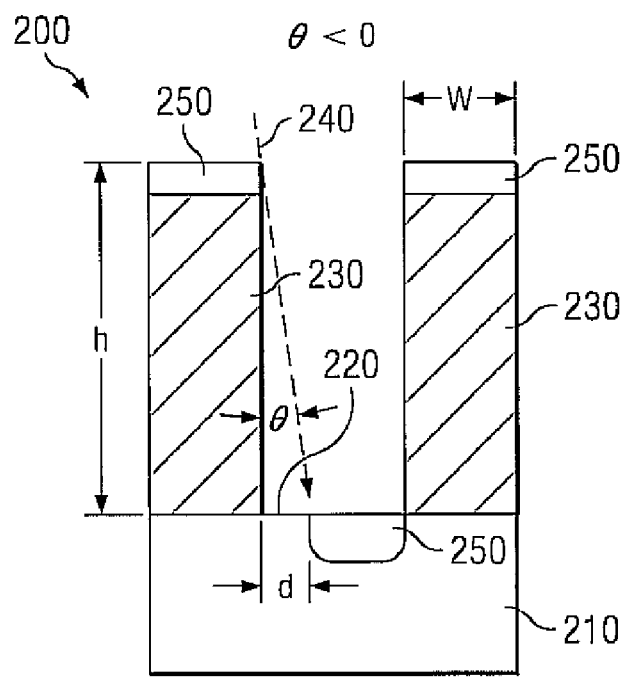

Referring now to FIGS. 2A and 2B, it will be appreciated that the incident angle of the ion beam 240 can have deposition errors in either an orientation where the incident angle θ is greater than zero (FIG. 2A) or an orientation where the incident angle θ is less than zero (FIG. 2B). Here, the device 200 appears as described in connection with FIG. 1, and includes substrate 210, shadowing structures 230, a distance "L" between the structures, ion beam 240 implanting regions 250 such as doped regions, and shadowed distance "d" defined as the difference between "L" and the implanted surface "x".

Figure 3A:
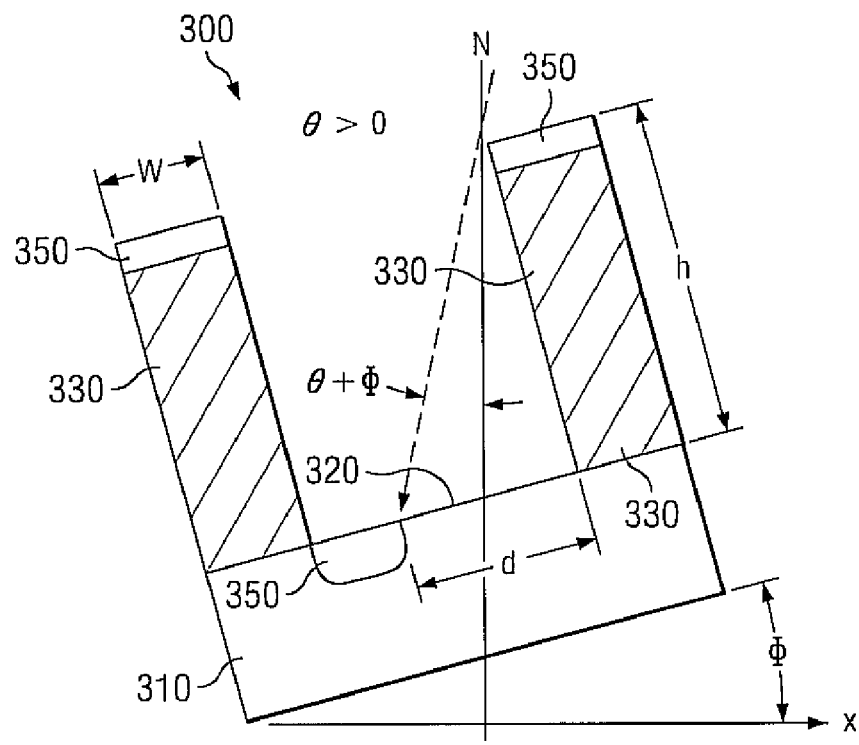
FIGS. 3A and 3B are side views illustrating ion beam angle shadowing with tilted substrates in accordance with various embodiments of the present teachings.
Figure 3B:
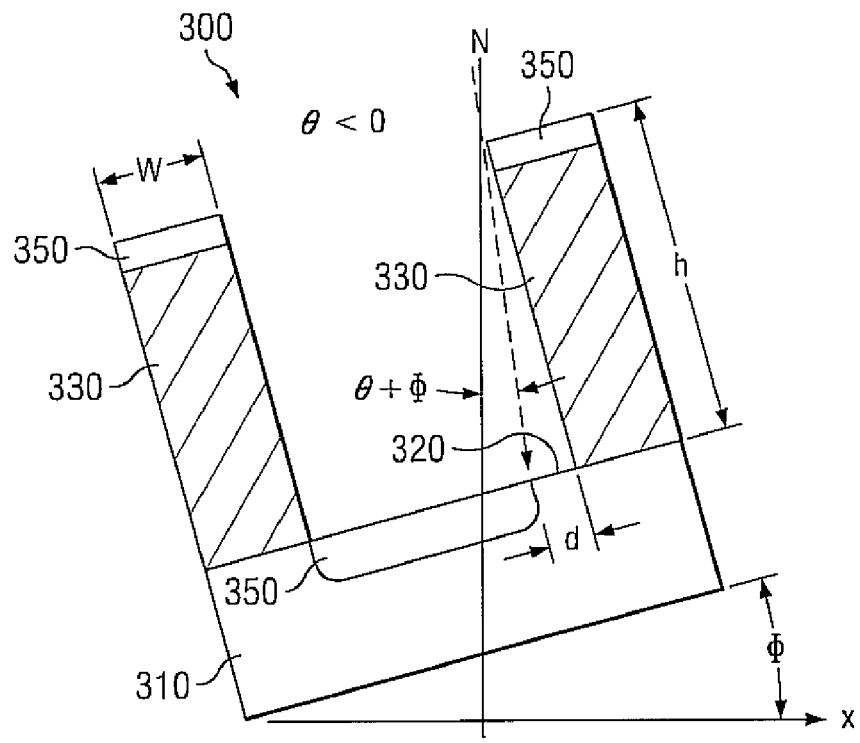

Turning now to FIGS. 3A and 3B, exemplary tilting of the substrate 310 and shadowing structures 330 is illustrated. Tilting the substrate 310 can increase the effective aspect ratio of the shadowing structures 320, which will increase the sensitivity to angle variation. The substrate 310 can be tilted in x- and y-directions in order to resolve angular components in both directions. The extent of error induced by a non-uniform shadowing structure 330 can be quantified by including structures with different distances between the shadowing structures 330 as illustrated in connection with region 540 of FIG. 5.

Figure 4:
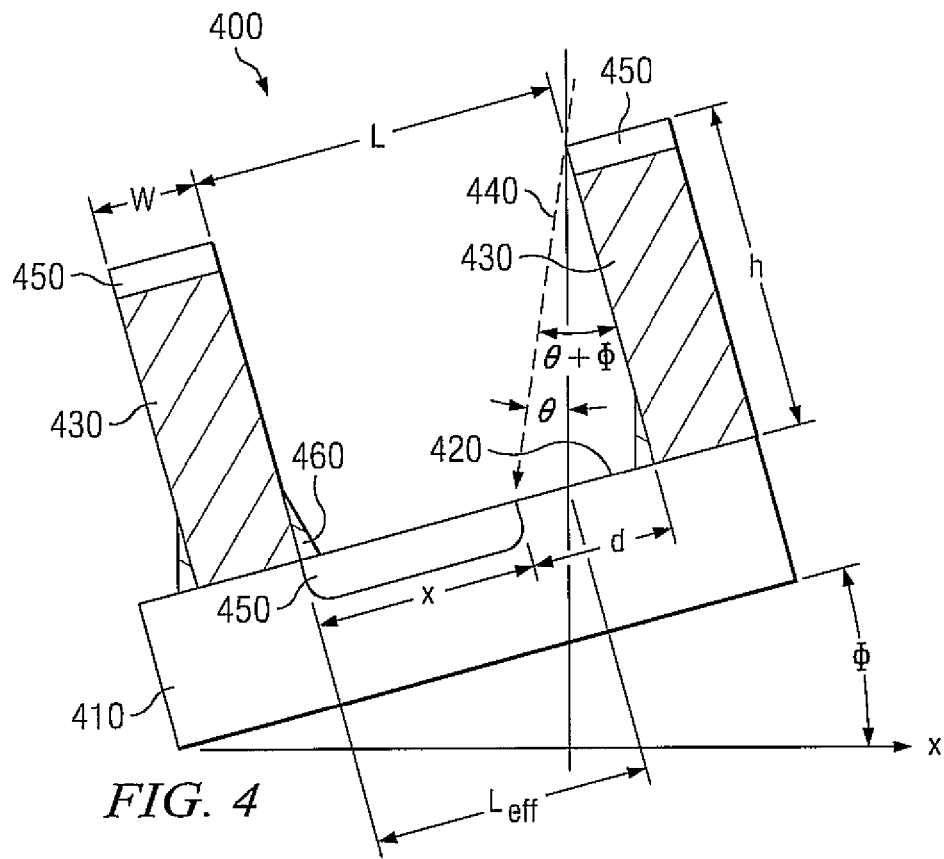
FIG. 4 is a side view illustrating ion beam angle shadowing with a tilted substrate having irregular shadowing structures in accordance with various embodiments of the present teachings.

By tilting the substrate 310 as described in the following, it is possible to obtain a positive or negative determination of the ion beam 340 angle. In general, the substrate 310 can be tilted at an angle greater than a maximum expected substrate-to-ion beam angle in order to quantify both the magnitude and direction of the angle. Intentionally tilting the substrate 310 will reduce the measurement error that might result from one or more non-uniform shadowing structures 330. A non-uniform shadowing structure can be one with non-vertical sidewall, or any other portion of the structure that might be non-uniform, such as a large sidewall angle or foot 460 as shown in FIG. 4. When the substrate is tilted, the shadowing distance "d" depends on the magnitude and the direction of θ. Examples of a tilt angle of the substrate can be from about 0 to about 25 degrees or more. More specifically, the tilt angle in part depends on "h" and "L"+As "h" increases relative to "d", the maximum measurable angle decreases. The maximum angle is determined by when 100% shadowing occurs and there is no implant into the substrate. If the aspect ratio h/L is large, the maximum angle is small. Each degree of increase in tilt angle will correspond to an increase in dose sensitivity.

In FIG. 3A, the substrate 310 is tilted such that the shadowing distance "d" is a result of an ion beam angle θ greater than zero, whereas the shadowing distance "d" in FIG. 3B is the result of an ion beam angle θ less than zero. Similar to that described in connection with FIGS. 1, 2A, and 2B, the implanted dose is proportional to x=L−d. The shadowed distance "d" depends on the angle error θ and tilt angle φ such that: d=htan(θ+φ), where θ is the ion beam angle, "h" is the photoresist or structure thickness, and φ is the substrate tilt angle.

Turning now to FIG. 4, there is illustrated a tilted substrate 410 having shadowing structures 430 formed thereon. The substrate 410 is tilted at an angle φ with respect to an x-axis. Ion implant occurs at 450, including surface area "x" on the substrate 410 such that shadowed area "d" remains as the difference between "L" and "x". When the structures include a deformation such as a foot area 460, a non-vertical sidewall or the like, tilting of the substrate 410 increases the effective aspect ratio of the shadowing structures 430 to increase angle sensitivity and thereby detect and factor out non-uniformity in the shadowing structures 430. Absent a tilting of the substrate 410, the aspect ratio (AR) is h/L. Upon tilting of the substrate, the dose sensitivity to angle error is increased, resulting in "effective" parameters of: AReff=h/Leff=h/(L−htan (φ)).

Measurement of the ion implant dose, or a related parameter, can be by any of several techniques. These techniques can include, but are not limited to, Secondary Ion Mass Spectrometry (SIMS), Low Energy Electron Induced X-ray Emission Spectrometry (LEXES), electrical resistance, junction staining, and Scanning Tunnel Microscope (STM).

Figure 5:
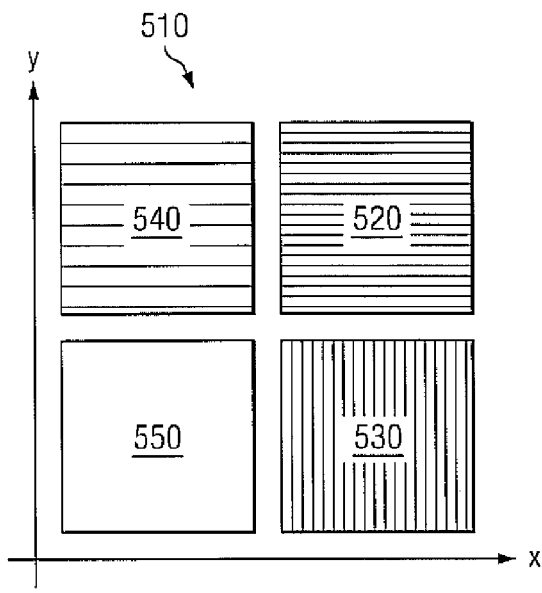
FIG. 5 is a top plan view illustrating multiple substrate regions having exemplary formation and orientations of shadowing structures in accordance with various embodiments of the present teachings.

FIG. 5 is a top plan view of a substrate depicting four regions of shadowing structures formed thereon. While four regions (520, 530, 540, and 550) are shown, it will be appreciated that more or less regions may be used according to a particular measurement needed. The regions are formed on the substrate 510 in order to obtain structure patterns having an x-orientation 520, a y-orientation 530, a region of differently spaced structures of (for example) an x-orientation 540, and a reference region 550. The separately patterned regions can be used individually or in combination. In any patterned region, the pluralities of structures are repetitively formed to increase the precision of measurement. Since the structure regions 520, 530, 540 and structure-free reference region 550 are grouped on the substrate 510, ion beam implantation occurs across all regions. Upon removal of the structures, an implant dose measurement can be taken in each of the regions, including the region 550 free of shadowing structures. This dose measurement in the structure free reference region 550 can serve as a reference to calibrate the measurements made in the regions containing shadowing structures. In each instance, the measurement used to obtain the implanted dose is compared to the reference implant.

The purpose of the reference region 550 can be used to determine a total incident implant dose independent of shadowing. The area of the implanted and non-implanted regions of the remaining regions 520, 530, 540 is determined by the measured dose. Specifically, they are determined by the reduction in dose caused by shadowing. In order to know how much the implanted dose was reduced due to shadowing, the total incident dose (independent of shadowing) must be known. That dose is measured in the reference region 550. If a reference region is not used, any error or variation in intended total incident dose will unknowingly be included in the angle calculation, reducing the accuracy of the techniques. By using the dose measured in the reference region, much of the implanter and metrology dose variation is eliminated. The angle between the beam and substrate can be calculated using the measured dose in the reference region 550 as follows. Take Ds as the measured dose in a structure region (520, 530, or 540), Dr as the measured dose in a reference region 550, and W as the width of a single shadowing structure. Dimensions W, h, and L are all measured using standard techniques such as SEM, scatterometry, etc. The shadowed distance "d" is calculated from the equation d=L−(Ds/Dr)(L+W). The angle the beam makes with the substrate is then $$\theta = \tan^{-1}(d/h).$$

Continuing with reference to FIG. 5, the oriented structures enable angular components to be determined. For example, with the set of structures oriented parallel to the x-axis, the angular component in the y-direction can be determined. If the substrate is not intentionally tilted, the magnitude of the angle can be measured in a given direction, but the sign (positive or negative) will not be known. Similarly, if one of the sets of structures is positioned parallel to the y-axis, the angular component in the x-direction can be determined. Also, the substrate can be tilted in the x-direction or the y-direction, or tilted such that the substrate has angular components in both the x- and y-directions in order to determine the two-dimensional angular components of the ion beam.

In each of the regions 520, 530, and 540 of FIG. 5, a different "L" dimension can be used. Alternatively, each of the regions can implement common "L" dimensions, but vary the orientation of the plurality of structures between each region as described.

Figure 6:
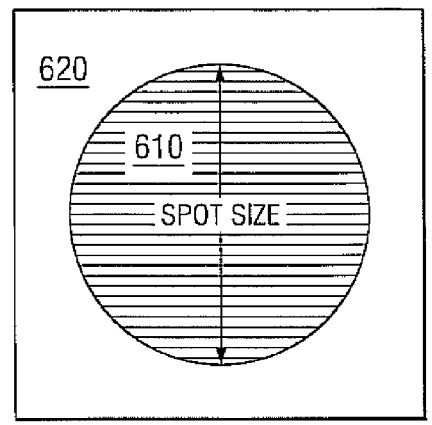
FIG. 6 is a top plan view illustrating a spot size in which an ion dose measurement is taken in accordance with various embodiments of the present teachings.

Referring to FIG. 6, a dose measurement can be taken in a predetermined area of the structured region defined as a "spot" 610. The spot size of the measurement should be much larger than the pitch of the shadowing structure to ensure high measurement precision and the spot must be confined within the area of the structure regions (520, 530, 540). This requirement can be satisfied with existing patterning and metrology capabilities. On-wafer site-level dose calibration can be accomplished using the open region 550 for which dose is not a function of angle. This built-in calibration standard reduces effects of implant-to-implant and within-wafer dose variation, as well as error from metrology variation.

An overall dimension of each of the respective regions 520, 530, 540, 550 can be on the order of 0.5 cm$^2$ to 100 cm$^2$ or more. The spot size of the metrology must be smaller than the respective region. Even further, the spot size of the metrology depends on the metrology type. A smaller size allows for more structures on the substrate. This has the advantage of allowing for determination of across-substrate angle uniformity and high resolution. A height "h" of a typical structure 130, 230, 330, 430 ranges from about 10 nm to about 10 μm, depending on the application. The height of the structure must be sufficient to block a 0-degree implant from completely penetrating the structure and entering the substrate. A high energy "MeV" implant would require an "h" on the order of microns, whereas a low energy "sub-keV" implant would require an "h" on the order of nanometers. And a spacing "L" between structures can be from 10 nm to several microns. Generally, a small "L" would be appropriate for a small "h" and so on.

Figure 7:
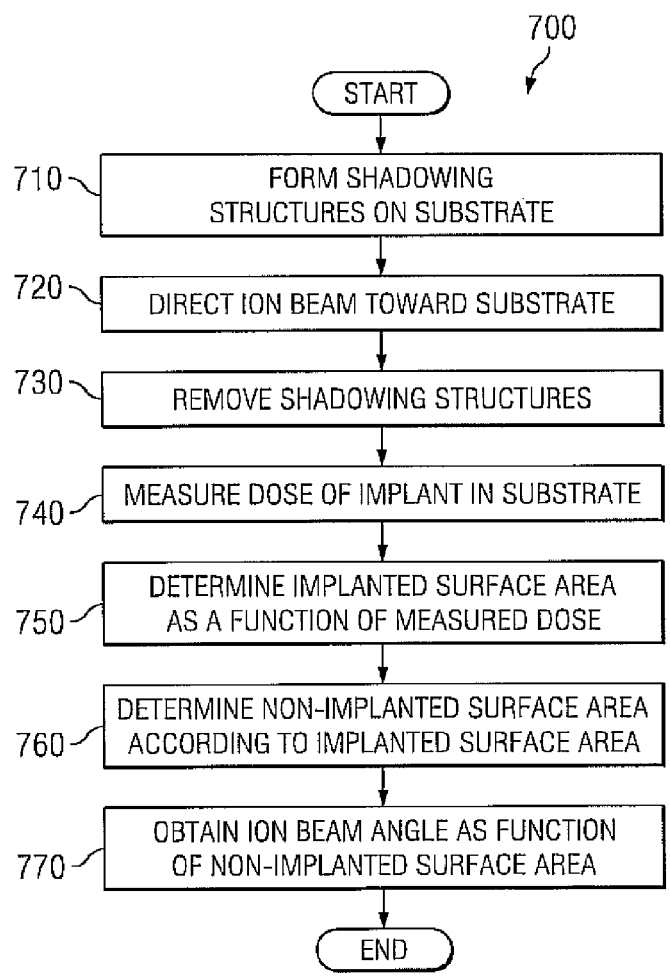
FIG. 7 is a flow chart for determining an ion beam angle in accordance with various embodiments of the present teachings.

The method to measure ion beam angle error generally follows the sequence of steps depicted in FIG. 7. In particular, shadowing structures are formed on the substrate at 710, and as described above in connection with FIGS. 1-4. Next, the ion beam can be directed toward the substrate at 720. The shadowing structures can be removed at 730. Certain metrology techniques may require additional processing. For example, electrical resistance measurements may require thermal annealing to activate the dopant. Other techniques such as SIMS and LEXES do not need additional processing. Subsequent to removal of the shadowing structures, measuring of the dose can occur at 740. The measured dose can be used to determine a surface area of the implant at 750. With the calculated surface area of the implant, the surface area of the non-implanted surface can be determined at 760. Then, the ion beam angle can be obtained as a function of the non-implanted (shadowed) surface area of the substrate as at 770.

Measuring of the dose at 740 can be by any of Secondary Ion Mass Spectrometry (SIMS), Low Energy Electron Induced X-ray Emission Spectrometry (LEXES), electrical resistance, junction staining, and Scanning Tunnel Microscope (STM) or other metrology techniques.

Determining the implanted surface area is a function of measured dose and the implanted dose is proportional to x=L−d. The ion beam angle error is determined by: d=htan($\theta$). For a tilted substrate, the ion beam angle error can be determined by: d=htan($\theta$+$\phi$) or AReff=h/Leff=h/(L−htan($\phi$)).

The measuring of structure height "h" and distance "L" between structures can be performed either prior to or after ion implant of the substrate and the three-dimensional structures.

It will be appreciated that the invention has been described in connection with the ion implantation dose; however, other deposition techniques can fall within the scope of the invention as understood by those of skill in the art.

While the invention has been illustrated with respect to one or more implementations, alterations and/or modifications can be made to the illustrated examples without departing from the spirit and scope of the appended claims. In addition, while a particular feature of the invention may have been disclosed with respect to only one of several implementations, such feature may be combined with one or more other features of the other implementations as may be desired and advantageous for any given or particular function. Furthermore, to the extent that the terms "including", "includes", "having", "has", "with", or variants thereof are used in either the detailed description and the claims, such terms are intended to be inclusive in a manner similar to the term "comprising."

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method for measuring ion beam angle with respect to a substrate, comprising:
   providing a plurality of shadowing structures extending substantially perpendicular from an upper surface of the substrate;
   tilting the substrate at a known angle relative to a first position;
   directing an ion beam toward the tilted substrate at an incident angle offset from normal to the substrate first position, the plurality of shadowing structures interrupting the ion beam to define implanted and non-implanted portions of the substrate;
   measuring the dose of implanted species within the substrate;
   determining an implanted surface area as a function of measuring the dose of implant;
   determining non-implanted surface area based on the implanted surface area; and
   obtaining the ion beam angle offset from normal to the substrate first position as a function of the non-implanted surface area and the known angle;
   wherein providing the plurality of shadowing structures comprises providing a plurality of regions of differently oriented shadowing structures and a region free of the plurality of shadowing structures; and
   wherein providing the plurality of regions of differently oriented shadowing structures comprises providing a first series of spaced shadowing structures oriented parallel to an x-axis of the substrate in a first region, and a second series of spaced shadowing structures oriented parallel to a y-axis of the substrate in a second region.

2. The method of claim 1, wherein the ion beam offset angle is obtained by a relationship d=htan($\theta$+$\phi$), where d is a shadowed distance, h is a shadowing structure height, $\theta$ is the ion beam angle offset from normal to the substrate first position, and $\phi$ is the known substrate tilt angle.

3. The method of claim 1, wherein the shadowing structures in at least one region are evenly spaced on the substrate.

4. The method of claim 1, wherein providing the plurality of shadowing structures comprises providing at least one region of shadowing structures that are spaced at greater distances apart than shadowing structures in at least a different region of the same orientation, and providing at least one region that is free of shadowing structures.

5. A method for measuring ion beam angle with respect to a substrate, comprising:
   providing a plurality of shadowing structures extending substantially perpendicular from an upper surface of the substrate;
   tilting the substrate at a known angle relative to a first position;
   directing an ion beam toward the tilted substrate at an incident angle offset from normal to the substrate first position, the plurality of shadowing structures interrupting the ion beam to define implanted and non-implanted portions of the substrate;
   measuring the dose of implanted species within the substrate;
   determining an implanted surface area as a function of measuring the dose of implant;
   determining non-implanted surface area based on the implanted surface area; and
   obtaining the ion beam angle offset from normal to the substrate first position as a function of the non-implanted surface area and the known angle;
   wherein the shadowed distance "d" is determined by a relationship d=L−(Ds/Dr)(L+W) where Ds is a measured dose in a region having shadowing structures, Dr is a measured dose in a region free of shadowing structures, L is a distance between structures, and W is a shadowing structure width.

6. The method of claim 5, wherein tilting the substrate at a known angle comprises tilting the substrate by an angle greater than the incident angle offset from normal to the substrate first position.

7. The method of claim 5, wherein measuring the dose of implanted species is by one or more of SIMS, LEXES, electrical resistance, junction staining, or STM.

8. The method of claim 5, wherein the non-implanted surface area is determined based on a difference between a total surface area and the determined implanted surface area.

9. The method of claim 5, wherein the implanted dose is proportional to L−d, where L is a distance between shadowing structures and d is a shadowed distance.

10. The method of claim 5, further comprising removing the plurality of shadowing structures from the substrate after defining the implanted and non-implanted portions and prior to measuring the dose of implanted species.

11. A method for measuring ion beam angle with respect to a substrate, comprising:
   providing a plurality of shadowing structures extending substantially perpendicular from an upper surface of the substrate;
   tilting the substrate at a known angle relative to a first position;
   directing an ion beam toward the tilted substrate at an incident angle offset from normal to the substrate first position, the plurality of shadowing structures interrupting the ion beam to define implanted and non-implanted portions of the substrate;
   measuring the dose of implanted species within the substrate;
   determining an implanted surface area as a function of measuring the dose of implant;
   determining non-implanted surface area based on the implanted surface area; and
   obtaining the ion beam angle offset from normal to the substrate first position as a function of the non-implanted surface area and the known angle;
   wherein providing the plurality of shadowing structures comprises providing a first series of equidistantly-spaced like shadowing structures oriented in an x-direction in a first region of the substrate; and providing a second series of equidistantly-spaced like shadowing structures oriented in a y-direction in a second region of the substrate.

12. The method of claim 11, wherein providing the plurality of shadowing structures further comprises providing a series of equidistantly-spaced like shadowing structures in a third region of the substrate oriented in the x- or y-direction and that are differently spaced from the corresponding shadowing structures in the first or second region that are oriented in the same x- or y-direction.

13. The method of claim 12, wherein the substrate further comprises a structure-free reference region.

14. The method of claim 13, further comprising removing the shadowing structures from the substrate after defining the implanted and non-implanted portions; and measuring the dose of implanted species comprises measuring the dose of implanted species in each of the first, second, third and reference regions.

15. The method of claim 14, wherein the dose of implanted species measured in each of the first, second and third regions is compared with the dose measured in the reference region.

16. The method of claim 15, wherein the implanted surface area is determined by comparing the doses measured in the first, second and third regions with the dose measured in the reference region.

17. A method for measuring ion beam angle with respect to a substrate, comprising:
   providing a plurality of shadowing structures extending substantially perpendicular from an upper surface of the substrate;
   tilting the substrate at a known angle relative to a first position;
   directing an ion beam toward the tilted substrate at an incident angle offset from normal to the substrate first position, the plurality of shadowing structures interrupting the ion beam to define implanted and non-implanted portions of the substrate;
   measuring the dose of implanted species within the substrate;
   determining an implanted surface area as a function of measuring the dose of implant;
   determining non-implanted surface area based on the implanted surface area; and
   obtaining the ion beam angle offset from normal to the substrate first position as a function of the non-implanted surface area and the known angle;
   wherein the ion beam offset angle is obtained by using the relationship $\theta=(\tan^{-1}(L-(Ds/Dr)(L+W))/h)-\phi$, where $\theta$ is the offset angle, L is a distance between shadowing structures, Ds is a dose measured in a region of shadowing structures, Dr is a dose measured in a region free of shadowing structures, W is a shadowing structure width, h is a shadowing structure height, and $\phi$ is the known substrate tilt angle.

18. A method for measuring ion beam angle with respect to a substrate, comprising:
   providing a first plurality of shadowing structures oriented in an x-direction and extending substantially perpendicular from an upper surface of a first region of the substrate;
   providing a second plurality of shadowing structures oriented in a y-direction and extending substantially perpendicular from an upper surface of a second region of the substrate;
   directing an ion beam toward the substrate, the first and second pluralities of shadowing structures interrupting an incident angle offset from normal of the ion beam to define implanted and non-implanted portions of the substrate;
   measuring the doses of implanted species within the first and second regions of the substrate;
   determining implanted surface areas of the first and second regions as a function of measuring the doses of implant;
   determining non-implanted surface areas of the first and second regions based on the implanted surface areas; and
   obtaining the ion beam offset angle as a function of the non-implanted surface areas.

19. The method of claim 18, further comprising tilting the substrate at a known angle in both the x- and y-directions prior to directing the ion beam toward the substrate; wherein the ion beam offset angle is obtained as a function of the non-implanted surface areas and the known angle.

* * * * *